United States Patent
Lee et al.

(10) Patent No.: US 6,365,454 B1
(45) Date of Patent: Apr. 2, 2002

(54) CYLINDRICAL CAPACITOR STRUCTURE AND METHOD OF MANUFACTURE

(75) Inventors: Tzung-Han Lee, Taipei; Alex Hou, Kaohsiung; Kun-Chi Lin, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/742,465

(22) Filed: Dec. 20, 2000

(30) Foreign Application Priority Data

Dec. 12, 2000 (TW) .......................................... 89126421

(51) Int. Cl.⁷ ........................................ H01L 21/8242
(52) U.S. Cl. ........................................ 438/255; 438/596
(58) Field of Search ................................ 438/253, 255, 438/396, 398, 595, 596, 634

(56) References Cited

U.S. PATENT DOCUMENTS

| | | | |
|---|---|---|---|
| 6,174,770 B1 * | 1/2001 | Chi | 438/255 |
| 6,197,700 B1 * | 3/2001 | Wang et al. | 438/745 |
| 6,218,241 B1 * | 4/2001 | Chuang | 438/596 |
| 6,225,203 B1 * | 5/2001 | Liu et al. | 438/595 |

* cited by examiner

*Primary Examiner*—Chandra Chaudhari
(74) *Attorney, Agent, or Firm*—Charles C. H. Wu; Charles C. H. Wu & Associates

(57) ABSTRACT

A cylindrical capacitor structure and a corresponding method of manufacture. To form the cylindrical capacitor, a conductive section, an etching stop layer, a first insulation layer, a bit line structure and a second insulation layer are sequentially formed over a substrate. A portion of the second insulation layer and the first insulation layer is removed until the etching stop layer is exposed. Ultimately, a plurality of gap-connected cylindrical openings and node contact openings between spacers are sequentially formed. Conductive spacers are formed on the sidewalls of the cylindrical openings and the node contact openings. In the meantime, material similar to the conductive spacers fills the small gaps, thereby forming an upper electrode for the capacitor. A dielectric layer is formed over the capacitor electrode. The exposed etching stop layer at the bottom of the contact opening is removed to expose the conductive section above the substrate. Finally, conductive material is deposited into the node contact openings and the cylindrical openings to become the lower electrodes and the node contacts respectively.

10 Claims, 4 Drawing Sheets

CYLINDRICAL CAPACITOR STRUCTURE AND METHOD OF MANUFACTURE

CROSS-REFERENCE TO RELATED APPLICATION

This application claims the priority benefit of Taiwan application serial no. 89126421, filed Dec. 12, 2000.

BACKGROUND OF THE INVENTION

1. Field of Invention

The present invention relates to an integrated circuit device and method of manufacture. More particularly, the present invention relates to a cylindrical capacitor structure and a corresponding method of manufacture that is especially suitable for fabricating dynamic random access memory (DRAM).

2. Description of Related Art

In general, a dynamic random access memory (DRAM) mainly consists of a metal-oxide-semiconductor (MOS) transistor and a capacitor. To increase the capacitance of the capacitor and reduce possible data errors and refreshing frequency, the capacitor is stacked on top of a bit line, thereby increasing the cross-sectional area. This is the so-called capacitor on bit (COB) line structure. In addition, for further increasing the surface area of a capacitor, a three-dimensional lower electrode is often formed inside the COB structure. The three-dimensional lower electrode can be a cylindrical lower electrode formed, for example, inside an opening in the dielectric layer above a node contact. The node contact electrically connects the lower electrode and the source/drain region of a MOS transistor.

A conventional DRAM cylindrical capacitor manufacturing includes the following steps. First, a substrate having a metal-oxide-semiconductor transistor thereon is provided. A first insulation layer is formed over the MOS transistor. A landed via is formed in the first insulation layer. The landed via is in electrical contact with a source/drain region of the MOS transistor. A second insulation layer is formed over the substrate and then a bit line is formed over the second insulation layer. A third insulation layer is formed over the bit line and then a first photolithographic and a first etching process are conducted. In the etching step, the second and the third insulation layer between the bit lines are etched through to form a node contact opening that exposes the landed via above the drain terminal. Polysilicon is next deposited into the node contact opening to form a node contact. A fourth insulation layer is formed over the substrate and then a cylindrical opening is formed in the fourth insulation layer so that a portion of the node contact is exposed. A first conformal conductive layer is formed over the substrate and then chemical-mechanical polishing (CMP) is conducted to remove the first conductive layer outside the cylindrical opening. A portion of the first conductive is retained to become a cylindrical lower electrode of a capacitor. The lower electrode is in electrical contact with node contact. A dielectric layer is formed over the lower electrode and then a second conductive layer is formed over the dielectric layer. A second photolithographic process and a second etching process is conducted to pattern the second conductive layer, thereby forming the upper electrode.

In the aforementioned method of manufacturing the cylindrical capacitor, photolithographic and etching process is performed twice. Moreover, the process of removing the first conductive layer outside the cylindrical opening by polishing often results in some residual slurry clinging to the surface of the cylindrical opening. The residual slurry may contaminate the material during backend processes.

SUMMARY OF THE INVENTION

Accordingly, one object of the present invention is to provide a method of manufacturing a cylindrical capacitor, especially suitable for fabricating dynamic random access memory (DRAM). A conductive section, an etching stop layer, a first insulation layer, a bit line structure and a second insulation layer are sequentially formed over a substrate. The bit line structure includes a cap layer above the bit line and spacers on the sidewalls of the bit line. A portion of the second insulation layer and the first insulation layer is removed until the etching stop layer is exposed. Ultimately, a plurality of gap-connected cylindrical openings and node contact openings between spacers are sequentially formed. Width of each gap is smaller than the node contact opening. Conductive spacers are formed on the sidewalls of the cylindrical openings and the node contact openings. In the meantime, material similar to the conductive spacers fills the small gaps, thereby forming an upper electrode for the capacitor. Up to this point, the originally linked cylindrical openings are no longer connected. A dielectric layer is formed over the capacitor electrode. The exposed etching stop layer at the bottom of the contact opening is removed to expose the conductive section above the substrate. Finally, conductive material is deposited into the node contact openings and the cylindrical openings to become the lower electrodes and the node contacts respectively.

This invention also provides a cylindrical capacitor structure that can be applied to the fabrication of DRAM devices. The cylindrical capacitor structure is formed by the aforementioned method. The cylindrical capacitor structure has an upper electrode that includes a layer of conductive material filling gaps and linking various conductive spacers of an identical material. The conductive spacers are located on the sidewalls of various cylindrical openings and node contact openings. The gaps are located between various cylindrical opening. In addition, the lower electrode of the capacitor is formed by filling the inner surface of the dielectric layer constituting the cylindrical openings. In fact, the upper and lower electrode of the capacitor in this invention is positioned in reverse to that of a conventional cylindrical capacitor.

The conductive section can be a landed via above the source/drain region of a MOS transistor or the source/drain region of a MOS transistor, for example.

This invention integrates the process of patterning out a mold (space that links the cylindrical openings and the gaps) for forming the upper electrode and the process of patterning the node contact openings and the cylindrical openings. Furthermore, width of the gap between the cylindrical openings is sufficiently narrow so that the cylindrical opening for accommodating the lower electrode can be separated out after complete formation of the upper electrode. Consequently, processing step in this invention is simplified because there is no need to perform photolithographic and etching process twice just to pattern out the upper electrode and the node contact opening. In addition, the lower electrode of the capacitor is formed by filling the inner surface of the dielectric layer that constitutes the cylindrical opening. Since there is no need to perform chemical-mechanical polishing, contamination by slurry can be prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
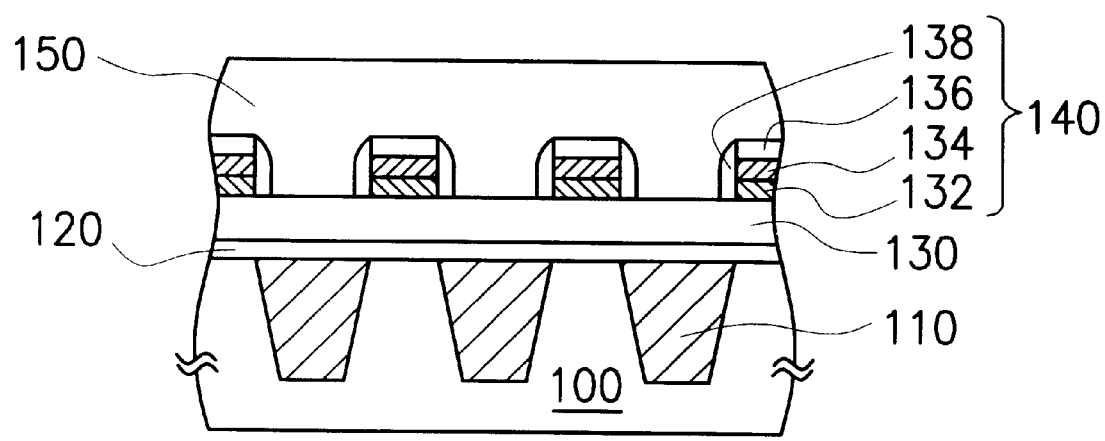
FIGS. 1 through 4 are schematic cross-sectional views showing the progression of steps for manufacturing a cylindrical capacitor according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1 through 4 are schematic cross-sectional views showing the progression of steps for manufacturing a cylindrical capacitor according to one preferred embodiment of this invention.

As shown in FIG. 1, a substrate 100 having a landed via 110 therein is provided. The landed via 110 is electrically connected to the source/drain terminal (not shown) of a metal-oxide-semiconductor (MOS) transistor. An etching stop layer 120, an insulation layer 130 and a bit line structure 140 are sequentially formed over the substrate 100 and the landed via 110. The etching stop layer 120 can be a silicon nitride layer and the insulation layer can be a silicon oxide layer, for example. The bit line structure 140 is a stack that includes a polysilicon layer 132, a metal silicide layer 134 and a cap layer 136. Spacers 138 are also formed on the sidewalls of the polysilicon layer 132, the silicide layer 134 and the cap layer 136. The polysilicon layer 132 and the metal silicide layer 134 together form a bit line. Both the cap layer 126 and the spacers 138 can be silicon nitride layer, for example. An insulation layer 150, for example, a silicon oxide layer is formed over the substrate 100.

Figure 2:
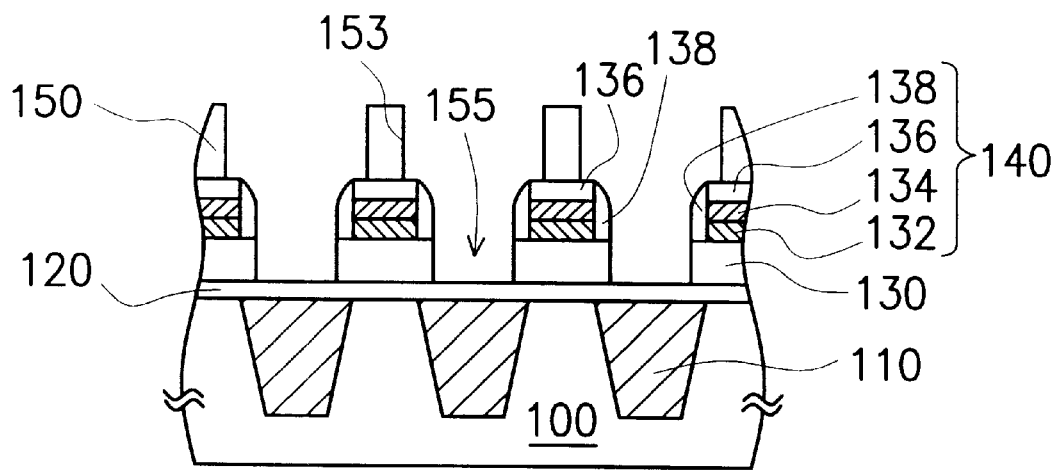
Figure 2A:
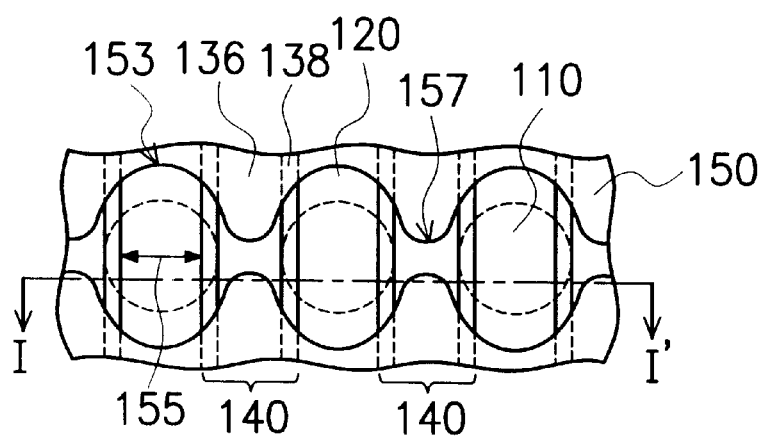
FIGS. 2A/3A are the top view of FIGS. 2/3, in fact, FIGS. 2/3 are cross-sectional views along line I–I'/II–II' respectively.

As shown in FIG. 2, the insulation layer 150 and 130 are etched until the etching stop layer 120 is exposed. Ultimately, a cylindrical opening 153 is formed in the insulation layer 150 and a node contact opening 155 is formed in the insulation layer 150 and 130 between the spacers 138. FIG. 2A is the top view of FIG. 2. In fact, FIG. 2 is a cross-sectional view along line I-I'. As shown in FIG. 2A, various cylindrical openings 153 are aligned in a row with neighboring cylindrical openings 153 linked by gaps 157. Direction of alignment for the cylindrical openings 153 is perpendicular to the bit line structure 140. Width of the gaps 157 is smaller than width of the contact openings 155. Furthermore, the row of cylindrical openings 153 and gaps 157 extend in both directions to the peripheral circuit regions (not shown) of this DRAM device. Moreover, the regions in FIG. 2A enclosed by dashed lines show the place where the landed vias 110 are positioned.

Figure 3:
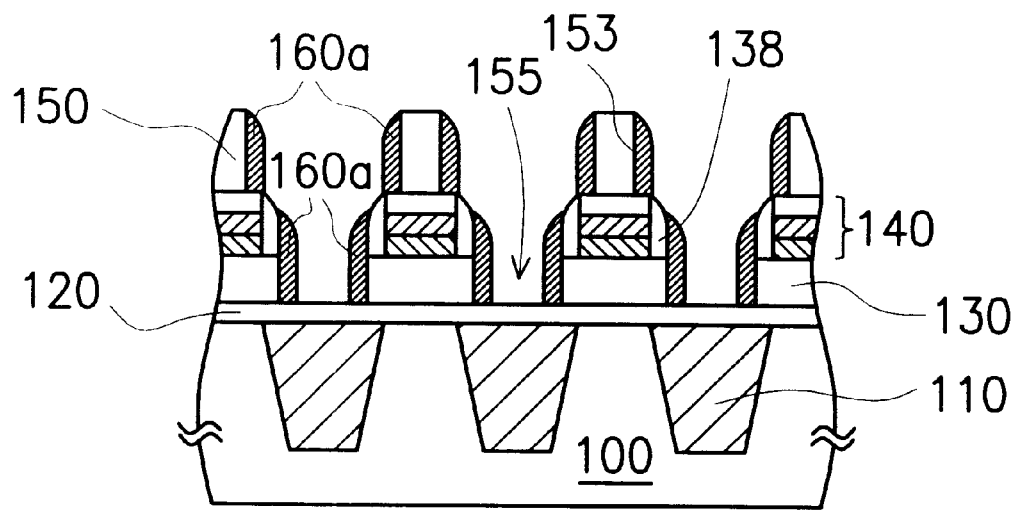
Figure 3A:
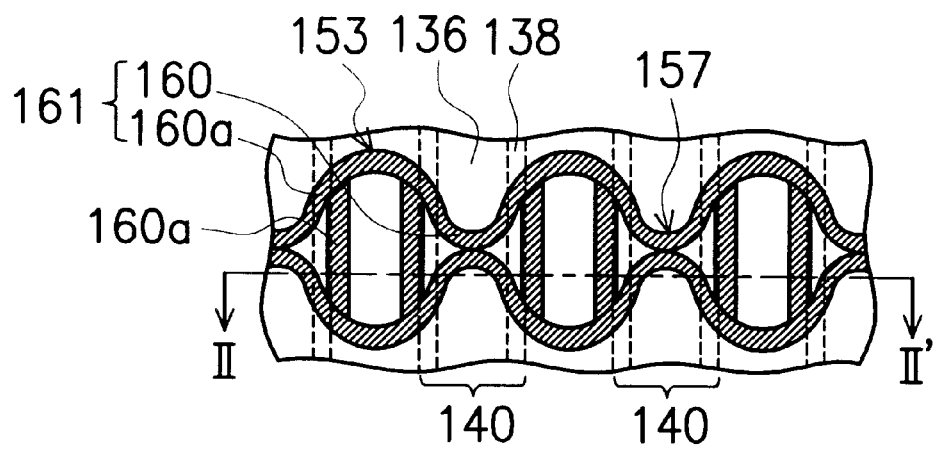

FIG. 3A is the top view of FIG. 3. In fact, FIG. 3 is a cross-sectional view along line II-II'. As shown in FIGS. 3 and 3A, a conformal conductive layer 160 is formed over the substrate (the conformal profile is not shown in the Fig.). The conductive layer 160 can be a polysilicon layer having a sufficient thickness just to cover the surface of the cylindrical opening 153 and the node contact opening 155 but enough material to fill up the narrower gaps 157. Hence, the originally linked cylindrical openings 153 are independently isolated. The conductive layer 160 is etched anisotropically to form conductive spacers 160a on the sidewalls of the cylindrical openings 153 and the node contact openings 155. The conductive spacers 160a and the conductive layer 160 in the gaps 157 together form an upper electrode 161 of a capacitor. Since the cylindrical openings 153 and the gaps 157 extends in both directions towards peripheral circuit regions of the DRAM device, the upper electrode 161 of the capacitor also extends to the peripheral circuit regions. Therefore, the capacitor can be controlled by the peripheral circuit.

Figure 4:
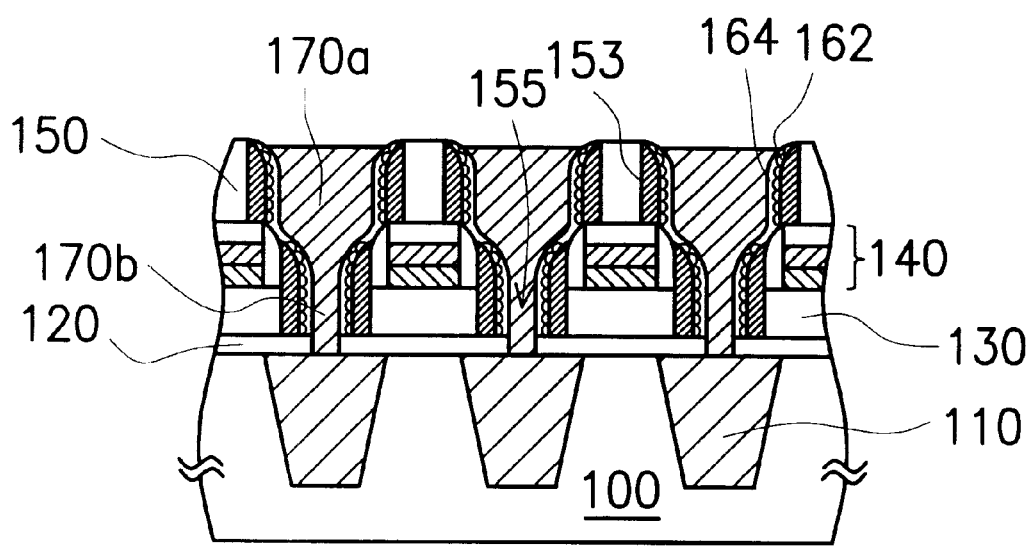

As shown in FIGS. 3A and 4, hemispherical silicon grains (HSG) 162 are formed on the surface of the upper electrode 161 to increase the effective surface area of the capacitor. A dielectric layer 164 is next formed over the hemispherical silicon grains 162. The exposed etching stop layer 130 at the bottom of the node contact openings 155 is etched to expose a portion of the landed vias 110. A conductive material such as polysilicon is deposited into the node contact openings 155 and the cylindrical openings 153 to form node contacts 170b and lower electrodes 170a respectively.

In the embodiment of this invention, the process of patterning out a mold (space that links the cylindrical openings 153 and the gaps 157) for forming the upper electrode 161 and the process of patterning the node contact openings 155 and the cylindrical openings 153 are integrated (FIG. 2A). Furthermore, width of the gap 157 between the cylindrical openings 153 is sufficiently narrow so that the cylindrical opening 153 for accommodating the lower electrode 170a can be separated out after complete formation of the upper electrode 161 (FIG. 3A). Consequently, processing step in this invention is simplified because there is no need to perform photolithographic and etching process twice just to pattern out the upper electrode and the node contact opening. In addition, the upper electrode 161 is formed by anisotropic etching while the lower electrode 170a is formed by filling the inner surface of the dielectric layer that constitutes the cylindrical openings 153. Since there is no need to perform chemicalmechanical polishing, contamination by slurry can be prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a cylindrical capacitor, especially suitable for fabricating dynamic random access memory (DRAM), comprising the steps of:

providing a substrate having a plurality of conductive sections thereon;

sequentially forming an etching stop layer, a first insulation layer and a plurality of bit lines over the substrate and the conductive sections, wherein each bit line has a cap layer on top and spacers on the sidewalls;

forming a second insulation layer that covers the substrate;

etching away a portion of the second insulation layer and the first insulation layer until a portion of the etching stop layer is exposed so that a plurality of cylindrical openings and a plurality of node contact openings are sequentially formed, wherein the node contact openings are between the spacers and a plurality of gaps links up neighboring cylindrical openings, and width of the gaps is smaller than width of the node contact openings;

forming a plurality of conductive spacers on the sidewalls of the cylindrical openings and the node contact openings and at the same time filling up the narrow gaps with a material identical to the conductive spacers so that the conductive spacers and the gap-filling conductive layer together form an upper electrode of a capacitor;

forming a dielectric layer over the surface of the upper electrode;

etching away the exposed etching stop layer at the bottom of the node contact openings so that a portion of the conductive sections is exposed; and depositing conductive material into the node contact openings and the cylindrical openings to form node contacts and lower electrodes of capacitors respectively.

2. The method of claim 1, wherein the plurality of cylindrical openings is arranged into rows so that only cylindrical openings in the same row are linked together.

3. The method of claim 2, wherein the rows of cylindrical openings run in a direction perpendicular to the bit lines.

4. The method of claim 1, wherein each conductive section is a landed via and the landed via is on the source/drain terminal of a metal-oxide-semiconductor transistor.

5. The method of claim 1, wherein the step of forming the upper electrode further includes the sub-steps of:

forming a conductive layer over the substrate such that the conductive layer is of sufficient thickness to fill the gaps but only enough to cover the surface of the cylindrical openings and the node contact openings; and performing an anisotropic etching of the conductive layer to form conductive spacers on the sidewalls of the cylindrical openings and the node contact openings, wherein the conductive spacers and the conductive material filling the gaps together form the upper electrode of the capacitor.

6. The method of claim 1, wherein after the step of forming the upper electrode, further includes growing hemispherical silicon grains on the surface of the upper electrode.

7. The method of claim 1, wherein each conductive section is the source/drain terminal of a metal-oxide-semiconductor transistor.

8. The method of claim 1, wherein material constituting the etching stop layer includes silicon nitride.

9. The method of claim 1, wherein material constituting the first insulation layer and the second insulation layer includes silicon oxide.

10. The method of claim 1, wherein material constituting the lower electrode and the node contact includes polysilicon.

* * * * *